United States Patent
Yang et al.

(10) Patent No.: US 8,531,221 B2
(45) Date of Patent: Sep. 10, 2013

(54) DELAY LOCK LOOP CIRCUIT AND METHOD

(75) Inventors: Tzu-Cheng Yang, New Taipei (TW); Chien-Hsi Lee, Miaoli County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/481,961

(22) Filed: May 29, 2012

(65) Prior Publication Data
US 2013/0200932 A1 Aug. 8, 2013

(30) Foreign Application Priority Data
Feb. 8, 2012 (TW) ................ 101104014 A (51) Int. Cl.
*H03L 7/06* (2006.01)
(52) U.S. Cl.
USPC ........................................ 327/157
(58) Field of Classification Search
USPC .......... 327/147–159; 375/373–376; 331/1 R
See application file for complete search history.

(56) References Cited

U.S. PATENT DOCUMENTS
6,815,986 B2 * 11/2004 Roy et al. .............. 327/149

* cited by examiner

*Primary Examiner* — Lincoln Donovan
*Assistant Examiner* — Sibin Chen
(74) *Attorney, Agent, or Firm* — Winston Hsu; Scott Margo (57) ABSTRACT

A delay lock loop circuit includes a voltage controlled delay line for generating a plurality of specific phase differential signals and a feedback signal according to an input clock source and a control voltage, a detector for comparing at least one of phases and frequencies of the input clock source and the feedback signal to generate at least one detection signal, a charge pump for generating the control voltage according to the at least one detection signal, and a phase selection buffer for generating the output clock source according to the plurality of specific phase differential signals, wherein each of the plurality of specific phase differential signals includes at least a non-inversion signal and an inversion signal, and the feedback signal is the inversion signal of one of the plurality of specific phase differential signals.

12 Claims, 6 Drawing Sheets

DELAY LOCK LOOP CIRCUIT AND METHOD

BACKGROUND OF THE INVENTION

1. Field of the Invention

The present invention relates to a delay lock loop circuit and method, and more particularly, to a delay lock loop circuit and method which feed back an inversion signal.

2. Description of the Prior Art

Figure 1:
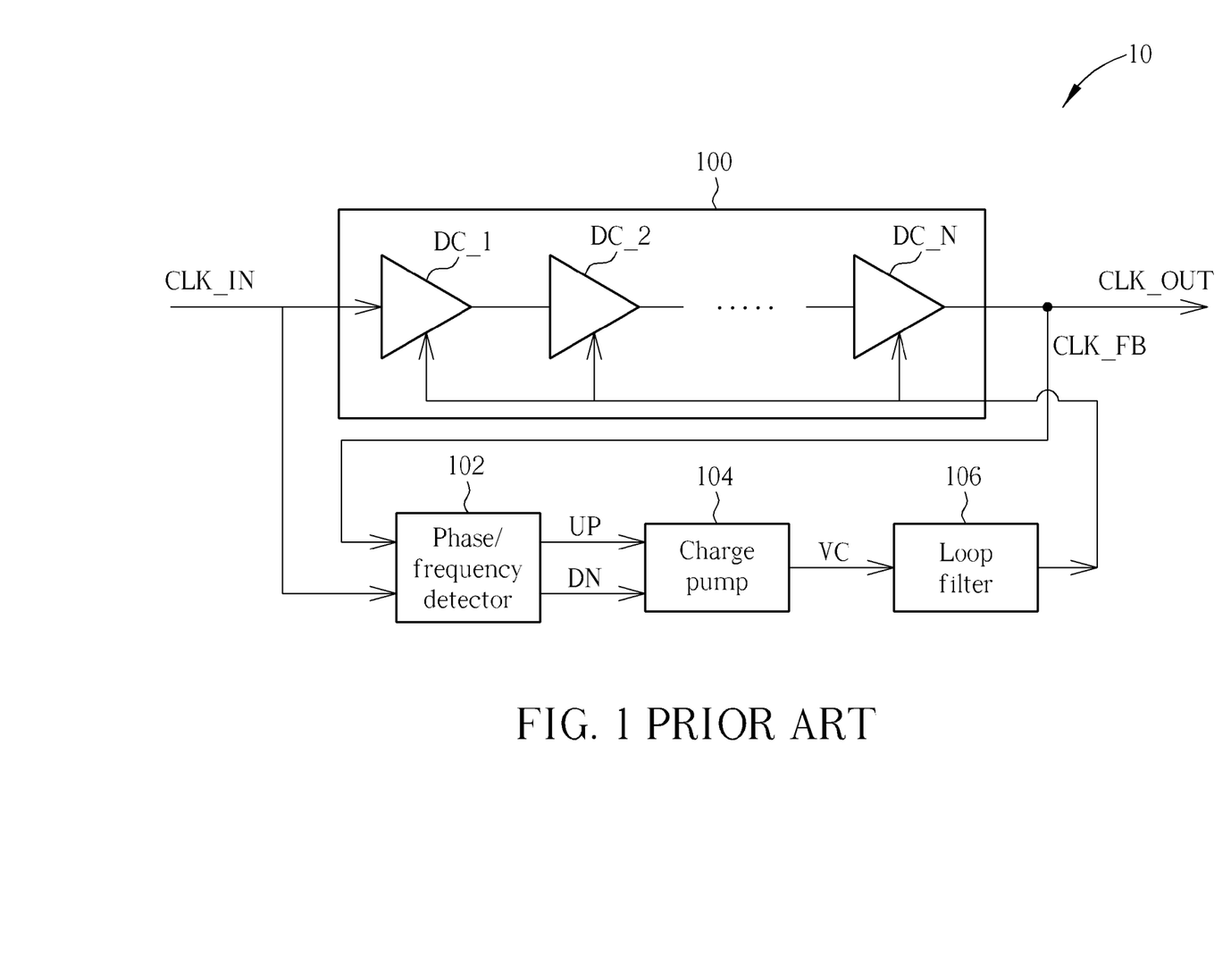
FIG. 1 illustrates a conventional schematic diagram of a delay lock loop circuit.

In the prior art, the delay lock loop (DLL) circuit utilizes N delay units to perform N stages of timing delay of an input clock source, so as to feed back a non-inversion clock source and to lock the input clock source with specific phases. Please refer to FIG. 1, which illustrates a conventional schematic diagram of a DLL circuit 10. As shown in FIG. 1, the DLL circuit 10 includes a voltage-controlled delay line (VCDL) 100, a phase/frequency detector 102, a charge pump 104 and a loop filter 106. After the VCDL 100 receives an input clock source CLK_IN, N delay units DC_1-DC_N generate the N stages of timing delay of the input clock source CLK_IN, so as to generate a feedback signal CLK_FB to the phase/frequency detector 102. The phase/frequency detector 102 simultaneously compares phase differences between the input clock source CLK_IN and the feedback signal CLK_FB, so as to output a first detection signal UP and a second detection signal DN to the charge pump 104. The charge pump 104 further generates a control voltage VC to the loop filter 106 according to the first detection signal UP and the second detection signal DN. Lastly, the loop filter 106 outputs the stabilized control voltage VC to the delay units DC_1-DC_N of the VCDL 100 as a reference, so as to output an output clock source CLK_OUT.

Therefore, in the prior art, a circuit designer has to utilize the delay units DC_1-DC_N and the feedback signal CLK_FB to realize the specific phase clock sources, which leads to a less flexible circuit design. Additionally, utilizing the delay units DC_1-DC_N results in a resolution of the specific phase clock source being 360/N, which provides less contribution to requirements of low production cost, low power consumption and high operational efficiency.

SUMMARY OF THE INVENTION

A delay lock loop circuit and method are provided, which can simultaneously elevate the resolution as well as reduce production cost.

According to an aspect of the disclosure, a delay lock loop circuit is provided to include a voltage controlled delay line for generating a plurality of specific phase differential signals and a feedback signal according to an input clock source and a control voltage; a detector for comparing at least one of phases and frequencies of the input clock source and the feedback signal to generate at least one detection signal; a charge pump for generating the control voltage according to the at least one detection signal; and a phase selection buffer for generating an output clock source according to the plurality of specific phase differential signals; wherein each of the plurality of specific phase differential signals comprises at least a non-inversion signal and an inversion signal, and the feedback signal is the inversion signal of one of the plurality of specific phase differential signals.

According to an aspect of the disclosure, a delay lock loop method is provided to include generating a plurality of specific phase differential signals and a feedback signal according to an input clock source and a control voltage; comparing at least one of phases and frequencies of the input clock source and the feedback signal to generate at least one detection signal; generating the control voltage according to the at least one detection signal; and generating an output clock source according to the plurality of specific phase differential signals; wherein each of the plurality of specific phase differential signals comprises at least a non-inversion signal and an inversion signal, and the feedback signal is the inversion signal of one of the plurality of specific phase differential signals.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
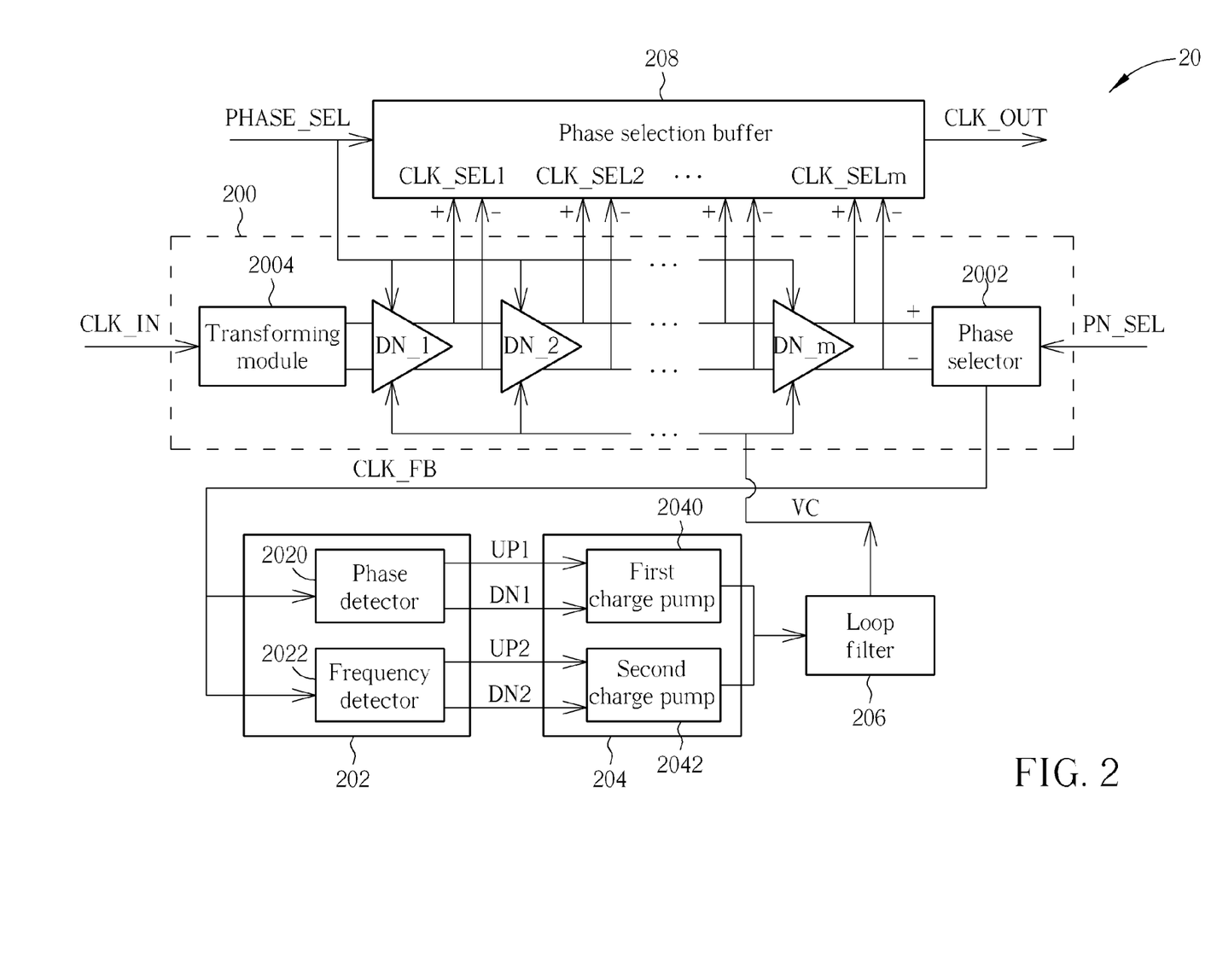
FIG. 2 illustrates a schematic diagram of a delay lock loop circuit according to an embodiment of the invention.

Please refer to FIG. 2, which illustrates a schematic diagram of a delay lock loop (DLL) circuit 20 according to an embodiment of the invention. As shown in FIG. 2, the DLL circuit 20 not only includes a voltage controlled delay line (VCDL) 200, a detector 202, a charge pump 204 and a loop filter 206, but also includes a phase selection buffer 208.

The detector 202 is installed to compare as least one of phases or frequencies of an input clock source CLK_IN and a feedback signal CLK_FB, so as to generate a detection signal as a comparison result. FIG. 2 also shows a detailed schematic diagram of an embodiment of the detector 202 which includes a phase/frequency detector. In the embodiment, the detector 202 includes a phase detector 2020. The phase detector 2020 compares phase differences of the input clock source CLK_IN and the feedback signal CLK_FB, so as to output the first detection signal UP1, UP2 as a detection result to the charge pump 204. Besides, the detector 202 further includes a frequency detector 2022 coupled to the charge pump 204. The frequency detector 2022 compares frequency differences of the input clock source CLK_IN and the feedback signal CLK_FB, so as to output the second detection signal DN1, DN2 as the detection result to the charge pump 204.

The charge pump 204 outputs a control voltage VC to the loop filter 206 according to at least one detection signal outputted from the detector 202. The loop filter 206 further maintains the control voltage VC within a predetermined voltage range, and then outputs the maintained control voltage VC to the VCDL 200. FIG. 2 also shows a detailed schematic diagram of an embodiment of the charge pump 204. In the embodiment, the charge pump 204 includes the first charge pump 2040 and the second charge pump 2042.

The first charge pump 2040 and the second charge pump 2042 determine phase differences and the frequency differences of the input clock source CLK_IN and the feedback signal CLK_FB according to the first detection signals UP1, UP2 and the second detection signals DN1, DN2, respectively, so as to determine how much compensation voltage is required for the input clock source CLK_IN, and to output the control voltage VC to the loop filter 206.

The VCDL 200 is installed to generate a plurality of specific phase differential signals CLK_SEL1-CLK_SELm according to the input clock source CLK_IN and the control voltage VC, so as to provide the specific phase differential signals CLK_SEL1-CLK_SELm to the phase selection buffer 208 and to generate the feedback signal CLK_FB for the detector 202. Each of the specific phase differential signals CLK_SEL1-CLK_SELm includes a non-inversion signal and an inversion signal, and the feedback signal CLK_FB is one of the inversion signals of the specific phase differential signals CLK_SEL1-CLK_SELm.

FIG. 2 also shows a detailed schematic diagram of an embodiment of the VCDL 200. In the embodiment, the VCDL 200 includes a plurality of delay units DN_1-DN_m, a phase selector 2002 and a transforming module 2004. First, the VCDL 200 receives the input clock source CLK_IN transformed by the transforming module 2004 as an input differential signal, so as to provide the input clock source CLK_IN to the first delay unit DN_1 as the input signal. Since the plurality of delay units DN_1-DN_m are serially coupled to each other, the delay units DN_1-DN_m serially generate the specific phase differential signals CLK_SEL1-CLK_SELm with different phase delays in the time domain based on the input clock source CLK_IN. Each of the specific phase differential signals CLK_SEL1-CLK_SELm includes the non-inversion signal and the inversion signal, and the non-inversion signal and the inversion signal have the same amplitude and phase difference of 180 degrees. Accordingly, the last delay unit DN_m outputs the specific phase differential signal including the non-inversion signal and the inversion signal to the phase selector 2002. In detail, the plurality of delay units DN_1-DN_m utilizes the control voltage VC as a reference to dynamically adjust the specific phase differential signals CLK_SEL1-CLK_SELm to be respectively output by them, so as to stabilize the specific phase differential signals CLK_SEL1-CLK_SELm for a predetermined period, which is defined by a user, and to perform further operations after stabilization. Next, the phase selector 2002 is utilized to generate the feedback signal CLK_FB according to the user's requirement. Preferably, the phase selector 2002, according to an enable signal PN_SEL, selects one inversion signal of the specific phase differential signal as the feedback signal CLK_FB to be referenced in later operations.

Noticeably, the above operation is a repeatable operation, so as to stabilize the specific phase differential signals CLK_SEL1-CLK_SELm outputted from the plurality of delay units DN_1-DN_m. After stabilizing the specific phase differential signals CLK_SEL1-CLK_SELm, the plurality of delay units DN_1-DN_m output the specific phase differential signals CLK_SEL1-CLK_SELm to the phase selection buffer 208 according to the enable signal PHASE_SEL. Lastly, the phase selection buffer 208 generates the output clock source CLK_OUT according to the specific phase differential signals CLK_SEL1-CLK_SELm.

Figure 3:
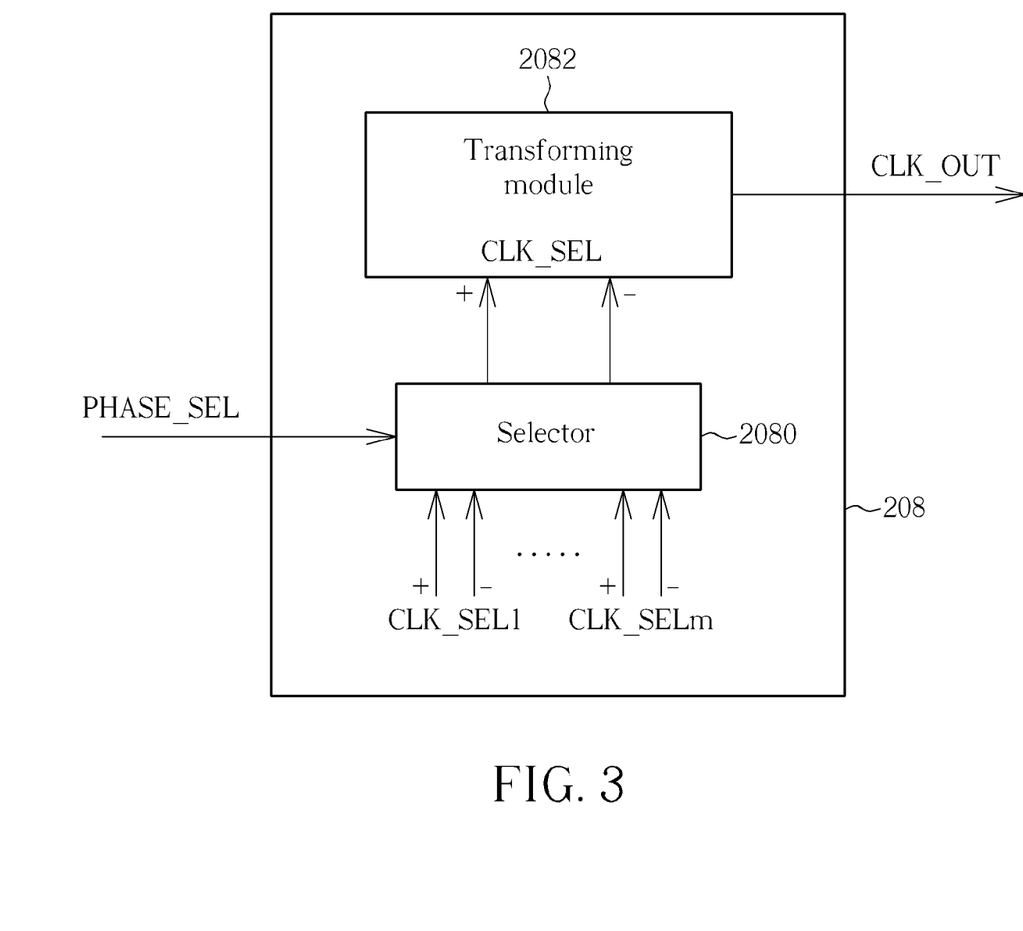
FIG. 3 illustrates a detail schematic diagram of the phase selection buffer shown in FIG. 2 according to an embodiment of the invention.

Please refer to FIG. 3, which illustrates a detailed schematic diagram of the phase selection buffer 208 shown in FIG. 2 according to an embodiment of the invention. In the embodiment, the phase selection buffer 208 further includes a selector 2080 and a transforming module 2082. The enable signal PHASE_SEL and the selector 2080 are utilized to select one of the specific phase differential signals CLK_SEL1-CLK_SELm as a selected phase differential signal CLK_SEL. The selected phase differential signal CLK_SEL is also a differential signal to include the non-inversion signal and the inversion signal. Lastly, the transforming module 2082 transforms the non-inversion signal and the inversion signal of the selected phase differential signal CLK_SEL to be the output clock source CLK_OUT, so as to output the output clock source CLK_OUT to a following circuit such as a passive load circuit (not shown in the figure). As a result, the DLL circuit 20 completes the operation of transforming the input clock source CLK_IN into the output clock source CLK_OUT.

Simply, the DLL circuit 20 receives the to be transformed input clock source CLK_IN inputted into the VCDL 200; the plurality of delay units DN_1-DN_m generate phase delays in the time domain; the phase selector 2002 feeds back one of the inversion signals of the specific phase differential signals CLK_SEL1-CLK_SELm to the detector 202; and, the charge pump 204 and the loop filter 206 are utilized to generate the control voltage VC to lock the input clock source CLK_IN, and then dynamically stabilize the specific phase differential signals CLK_SEL1-CLK_SELm. Therefore, those skilled in the art can additionally modify or install other related circuits according to the embodiment of the invention, so as to achieve the same or similar purpose of transforming the input clock signal CLK_IN into the inversion signal, which is also in the scope of the invention.

Furthermore, the specific phase differential signals CLK_SEL1-CLK_SELm are inputted into the phase selection buffer 208, where the selector 2080 and the transforming module 2082 are utilized to select one of the specific phase differential signals CLK_SEL1-CLK_SELm as the output clock signal CLK_OUT. According to different user's requirements, many of the specific phase differential signals CLK_SEL1-CLK_SELm can also be preserved for the next operation, or the specific phase differential signals CLK_SEL1-CLK_SELm can be transformed to a plurality of specific phase signals in advance, which means the non-inversion signal and the inversion signal of each of the plurality of specific phase differential signals are integrated into the specific phase signal. Then, at least one of the specific phase signals is selected to be the output clock signal CLK_OUT.

Figure 4:
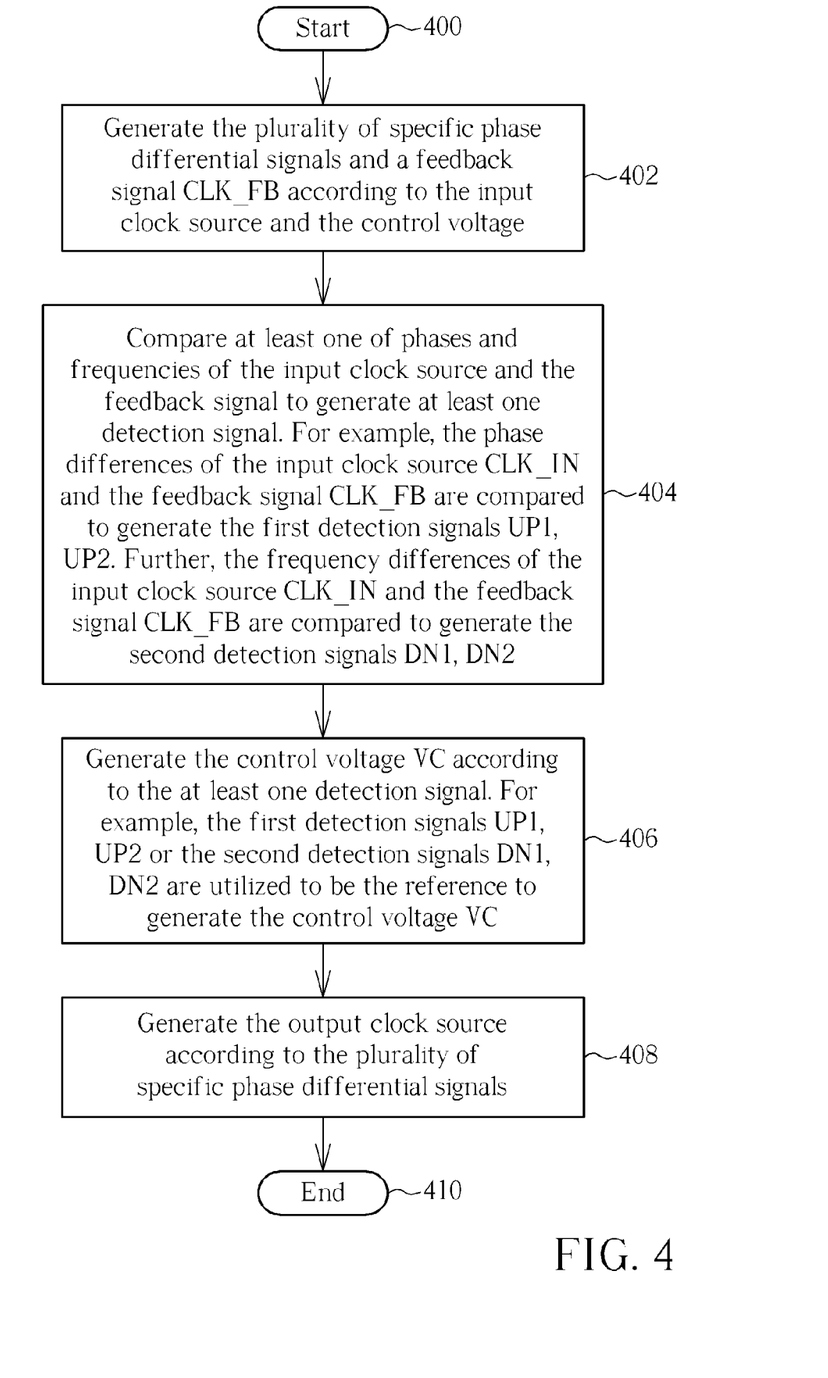
FIG. 4 illustrates a flow chart of a delay lock loop process according to an embodiment of the invention.

Noticeably, the embodiment of the invention provides an operational process utilizing the DLL circuit 20, which can be summarized as a delay lock loop process 40, as shown in FIG. 4. The delay lock loop process 40 includes the steps as following:

Step 400: Start.

Step 402: Generate the plurality of specific phase differential signals and a feedback signal CLK_FB according to the input clock source and the control voltage.

Step 404: Compare at least one of phases and frequencies of the input clock source and the feedback signal to generate at least one detection signal. For example, the phase differences of the input clock source CLK_IN and the feedback signal CLK_FB are compared to generate the first detection signals UP1, UP2. Further, the frequency differences of the input clock source CLK_IN and the feedback signal CLK_FB are compared to generate the second detection signals DN1, DN2.

Step 406: Generate the control voltage VC according to the at least one detection signal. For example, the first detection signals UP1, UP2 or the second detection signals DN1, DN2 are utilized to be the reference to generate the control voltage VC.

Step 408: Generate the output clock source according to the plurality of specific phase differential signals.

Step 410: End.

Each of the specific phase differential signals includes one non-inversion signal and one inversion signal, and the feedback signal is the inversion signal of the one of the specific phase differential signals. In all, details of each of the steps of the delay lock loop process 40 can be understood from the above description of the DLL circuit 20 with reference to FIG. 2 and FIG. 3, and are not described again here.

Figure 5:
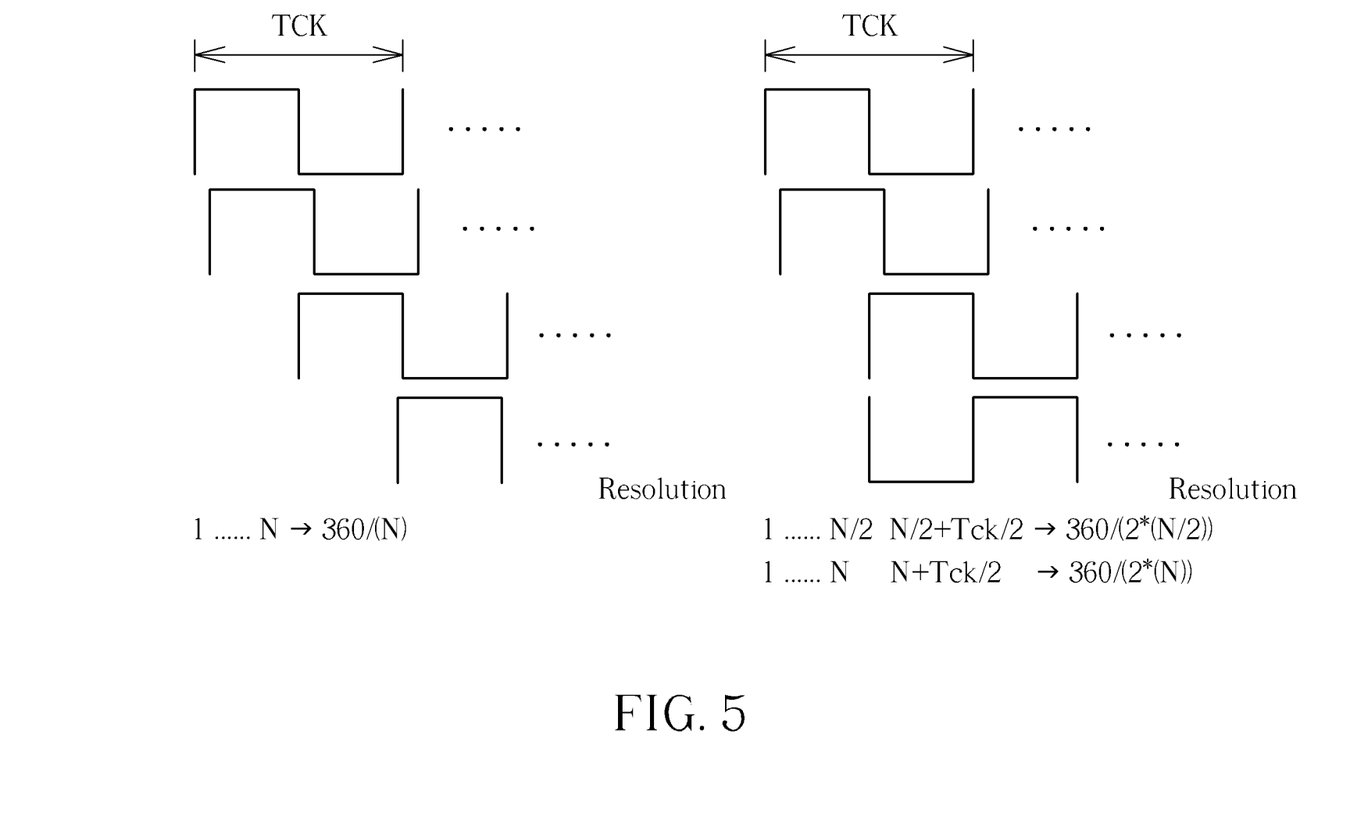
FIG. 5 illustrates a schematic diagram in the time domain to compare an embodiment of the invention utilizing the plurality of specific phase differential signals with the prior art.

Noticeably, the DLL circuit 20 utilizing the phase selector 2002 to feed back the inversion signal can enhance the resolution of the applied product in comparison with the prior art which feeds back the non-inversion signal. Please refer to FIG. 5, which illustrates a schematic diagram in the time domain to compare an embodiment of the invention utilizing the plurality of specific phase differential signals with the prior art, wherein the left corresponds to the prior art and the right corresponds to the embodiment of the invention. As shown in FIG. 5, within one periodic time period TCK, the DLL circuit 10 of the prior art utilizes the N delay units for the input clock source CLK_IN to output the specific phase differential signals with the resolution of 360/N, which means any two of the specific phase differential signals have an interval of phase delays of 360/N within the periodic time period TCK. However, the embodiment of the invention which feed back the inversion signal can reverse every phase of the specific phase differential signals CLK_SEL1-CLK_SELm. Under these circumstances, if the user sets the parameter m to be N/2, the DLL circuit 20 can achieve the same resolution as 360/N while providing smaller utilized layout area as well as less input power; if the user sets the parameter m to be N, a higher resolution of 360/2N can be obtained and more options of the output clock source can be selected by the user.

Figure 6:
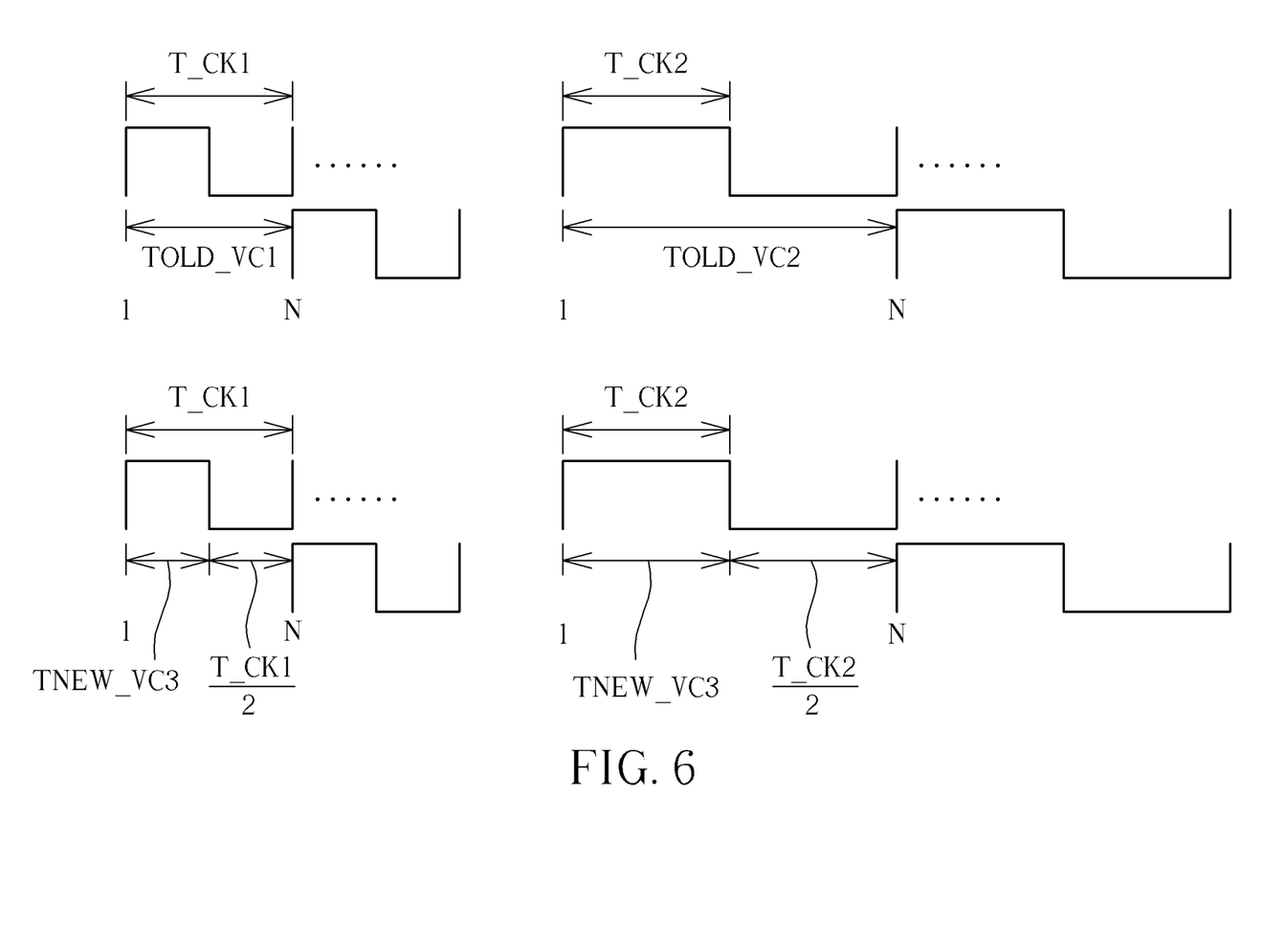
FIG. 6 illustrates a schematic diagram with different input clock sources to compare the delay lock loop circuit 20 of the invention with the prior art.

Please refer to FIG. 6, which illustrates a schematic diagram with different input clock sources to compare the DLL circuit 20 of the invention with the prior art. As shown in FIG. 6, for different input clock sources T_CK1 or T_CK2, the VCDL 100 of the prior art respectively defines different operational ranges as T_DELAY=TOLD_VC1 or T_DELAY=TOLD_VC2, which means that the operational range of the VCDL 100 cannot be changed by correspondingly changing the control voltage. However, the DLL circuit 20 provides another concept, which defines the operational range as T_DELAY=TNEW_VC3+(T_CK1/2) with the input clock source T_CK1, which can also be rewritten as TNEW_VC3=T_DELAY−(T_CK1/2). If the input clock source changes from T_CK1 to T_CK2, a response timing of the VCDL 200 will change from TNEW_VC3 to TNEW_VC4 to satisfy the above formula as well, i.e. complying with TNEW_VC4=T_DELAY−(TCK2/2). In other words, the operational range of the VCDL 200 can be changed by correspondingly changing the control voltage of the VCDL 200, so as to provide a more flexible operational range for different user requirements.

In summary, an embodiment of the invention provides a delay lock loop circuit and method thereof which utilize a phase selector of a voltage controlled delay line to handle an input clock source in advance and to feedback an inversion signal, so as to dynamically adjust a plurality of specific phase differential signals generated by the voltage controlled delay line to achieve a stable state; then, a phase selection buffer is utilized to transform the plurality of specific phase differential signals to an output clock source. Under a fixed number of delay units, the embodiment of the invention can provide a better output signal having double resolution in comparison with the prior art; with different input clock sources, the embodiment of the invention also can provide a more flexible operational range to expand the available product application field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay lock loop circuit comprising:
   a voltage controlled delay line (VCDL) comprising:
      a plurality of delay units for generating a plurality of specific phase differential signals according to an input clock source and a control voltage; and
      a phase selector for receiving the one of the plurality of specific phase differential signals to output an inversion signal of the one of the plurality of specific phase differential signals as a feedback signal;
   a detector for comparing at least one of phases and frequencies of the input clock source and the feedback signal to generate at least one detection signal;
   a charge pump for generating the control voltage according to the at least one detection signal; and
   a phase selection buffer for generating an output clock source according to the plurality of specific phase differential signals;
   wherein each of the plurality of specific phase differential signals comprises at least a non-inversion signal and an inversion signal, and the feedback signal is the inversion signal of one of the plurality of specific phase differential signals.

2. The delay lock loop circuit of claim 1, wherein the phase selection buffer further comprises:
   a selector for selecting a selected phase differential signal from one or more of the plurality of specific phase differential signals according to an enable signal, wherein the selected phase differential signal comprises a non-inversion signal and an inversion signal.

3. The delay lock loop circuit of claim 2, wherein the phase selection buffer further comprises:
   a transforming module for transforming the non-inversion signal and the inversion signal of the selected phase differential signal into a single-phase signal being the output clock source.

4. The delay lock loop circuit of claim 1, wherein the VCDL further comprises a transforming module for transforming the input clock source into an input differential signal to one of the plurality of delay units.

5. The delay lock loop circuit of claim 1, further comprising a loop filter coupled between the charge pump and the VCDL.

6. The delay lock loop circuit of claim 1, wherein the detector comprises a phase detector for comparing the phases of the input clock source and the feedback signal to generate one of the at least one detection signal.

7. The delay lock loop circuit of claim 6, wherein the detector further comprises a frequency detector for comparing the frequencies of the input clock source and the feedback signal to generate another one of the at least one detection signal.

8. A delay lock loop method comprising:
   performing a plurality of delay operations for generating a plurality of specific phase differential signals according to an input clock source and a control voltage;
   receiving one of the plurality of specific phase differential signals to output an inversion signal of the one of the plurality of specific phase differential signals as a feedback signal;

comparing at least one of phases and frequencies of the input clock source and the feedback signal to generate at least one detection signal;
generating the control voltage according to the at least one detection signal; and
generating an output clock source according to the plurality of specific phase differential signals;
wherein each of the plurality of specific phase differential signals comprises at least a non-inversion signal and an inversion signal, and the feedback signal is the inversion signal of one of the plurality of specific phase differential signals.

9. The delay lock loop method of claim 8, wherein the step of receiving the one of the plurality of specific phase differential signals and outputting the inversion signal of the one of the plurality of specific phase differential signals as the feedback signal further comprises:
selecting a selected phase differential signal from one or more of the plurality of specific phase differential signals according to an enable signal; and
transforming the non-inversion signal and the inversion signal of the selected phase differential signal into a single-phase signal being the output clock source.

10. The delay lock loop method of claim 8, further comprising transforming the input clock source into an input differential signal to be utilized to perform one of the plurality of delay operations before finishing the plurality of delay operations.

11. A delay lock loop circuit comprising:
a voltage controlled delay line (VCDL) comprising:
a plurality of delay units for generating a plurality of specific phase differential signals according to an input clock source and a control voltage; and
a phase selector for receiving one of the plurality of specific phase differential signals to output an inversion signal of the one of the plurality of specific phase differential signals as a feedback signal;
a detector for comparing at least one of phases and frequencies of the input clock source and the feedback signal to generate at least one detection signal;
a charge pump for generating the control voltage according to the at least one detection signal; and
a phase selection buffer for generating an output clock source according to the plurality of specific phase differential signals;
wherein the feedback signal is an inversion signal of one of the plurality of specific phase differential signals.

12. A delay lock loop method comprising:
performing a plurality of delay operations for generating a plurality of specific phase differential signals according to an input clock source and a control voltage;
receiving one of the plurality of specific phase differential signals to output an inversion signal of the one of the plurality of specific phase differential signals as a feedback signal;
comparing at least one of phases and frequencies of the input clock source and the feedback signal to generate at least one detection signal;
generating the control voltage according to the at least one detection signal; and
generating an output clock source according to the plurality of specific phase differential signals;
wherein the feedback signal is an inversion signal of one of the plurality of specific phase differential signals.

* * * * *